United States Patent
Solt et al.

(10) Patent No.: US 8,829,898 B1
(45) Date of Patent: Sep. 9, 2014

(54) METHOD AND APPARATUS FOR TESTING

(75) Inventors: Yosef Solt, Atzmon-Segev (IL); Asaf Idan, Rehovot (IL); Ofer Benjamin, Haifa (IL); Eli Kurin, Zichron Yaakov (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 621 days.

(21) Appl. No.: 13/154,745

(22) Filed: Jun. 7, 2011

Related U.S. Application Data (60) Provisional application No. 61/357,462, filed on Jun. 22, 2010.

(51) Int. Cl.
    *G01N 27/82* (2006.01)
(52) U.S. Cl.
    USPC ............... 324/240; 324/209; 324/762.02
(58) Field of Classification Search
    USPC ............ 324/750.03, 750.3, 209, 240, 762.01, 324/762.1
    See application file for complete search history.

(56) References Cited

U.S. PATENT DOCUMENTS

| | | | | |
|---|---|---|---|---|
| 5,982,189 | A | * | 11/1999 | Motika et al. ............ 324/750.03 |
| 7,385,383 | B2 | * | 6/2008 | Reddy et al. ............... 324/76.11 |

OTHER PUBLICATIONS

Aad Offerman, et al., "An Open Notation for Memory Tests", Section Computer Architecture & Digital Technique, pp. 1-8, Department of Electrical Engineering, Delft University of Technology, Mekelweg 4, 2628 CD Delft, The Netherlands.

Georgi Nedeltchev Gaydadjiev, "Testing of Modern Semiconductor Memory Structures", Sep. 25, 2007, pp. 1-121, Delft.

* cited by examiner

*Primary Examiner* — Arleen M Vazquez
*Assistant Examiner* — Alesa Allgood (57) ABSTRACT

Aspects of the disclosure provide a method for testing. The method includes determining an electrical characteristic of an integrated circuit (IC), subjecting the IC to a stress test, characterizing the electrical characteristic of the IC subsequently to subjecting the IC to the stress test, and determining a quality attribute of the IC based on a comparison of the respective electrical characteristics of the IC before and after subjecting the IC to the stress test.

20 Claims, 6 Drawing Sheets

```
Tran_Plus = upper search boundary; //Initialization
Tran_Minus = lower search boundary; //Initialization Repeat
    Supply_Voltage = (Tran_Plus+ Tran_Minus)/2; // middle point
    T1 = Destructive_Read (0, Supply_Voltage); // write 0, and read multiple times
    T2 = Destructive_Read (1, Supply_Voltage); // write 1, and read multiple times
    If (T1 == PASS and T2= PASS)
        Tran_Plus = Supply_Voltage;
    Else
        Tran_Minus = Supply_Voltage;
Until ( Tran_Plus - Tran_Minus <= minimum voltage step)

Return (Tran_Plus);
```

METHOD AND APPARATUS FOR TESTING

INCORPORATION BY REFERENCE

This application claims the benefit of U.S. Provisional Application No. 61/357,462, "Delta Min VDD" filed on Jun. 22, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, chip testing uses deterministic thresholds. In an example test, a minimum supply voltage at which an integrated circuit (IC) product is required to properly function is pre-determined for the IC. During testing, a test system tests IC chips and determines the minimum supply voltage at which a given IC chip is able to properly function. When the given chip requires, in order to properly function, a minimum supply voltage that is in excess of a minimum specified supply voltage, the chip is marked as a defective chip.

SUMMARY

Aspects of the disclosure provide a method for testing. The method includes determining an electrical characteristic of an integrated circuit (IC), subjecting the IC to a stress test, characterizing the electrical characteristic of the IC subsequently to subjecting the IC to the stress test, and determining a quality attribute of the IC based on a comparison of the respective electrical characteristics of the IC before and after subjecting the IC to the stress test. The electrical characteristics can be any suitable parameters, such as a minimum supply voltage required to enable the IC to successfully pass a functional test, a standby current of the IC, a power consumption of the IC, and the like.

In an embodiment, to determine the electrical characteristic of the IC before the stress test, the method includes characterizing the electrical characteristic of the IC before subjecting the IC to the stress test. In another embodiment, the method includes determining the electrical characteristic of the IC based on stored data of a previous characterization for the IC performed before the stress test.

In an embodiment, the method includes characterizing a minimum supply voltage required to enable the IC to successfully pass a functional test. In an example, the method includes characterizing a minimum supply voltage required to enable a memory on the IC to successfully pass a destruction-read test.

Aspects of the disclosure also provide a test system. The test system includes stress equipment configured to subject an integrated circuit (IC) to a stress test, test equipment configured to perform test to characterize an electrical characteristic of the IC, and a controller configured to determine the electrical characteristic of the IC before the stress test, control the test equipment to characterize the electrical characteristic of the IC subsequently to subjecting the IC to the stress test, and determine a quality attribute of the IC based on a comparison of the respective electrical characteristics of the IC before and after subjecting the IC to the stress test.

Aspects of the disclosure also provide an integrated circuit (IC). The IC includes a functional circuit, and a built-in-self-test (BIST) module. The BIST module is configured to be operative in a test mode to perform built-in self test. The BIST module is configured to perform the built-in self test for a first time to determine an electrical characteristic of the functional circuit before subjecting the functional circuit to a stress test, perform the built-in self test for a second time to determine the electrical characteristic of the functional circuit after subjecting the functional circuit to the stress test, and determine a quality attribute of the functional circuit based on a comparison of the respective electrical characteristics of the functional circuit before and after the stress test.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
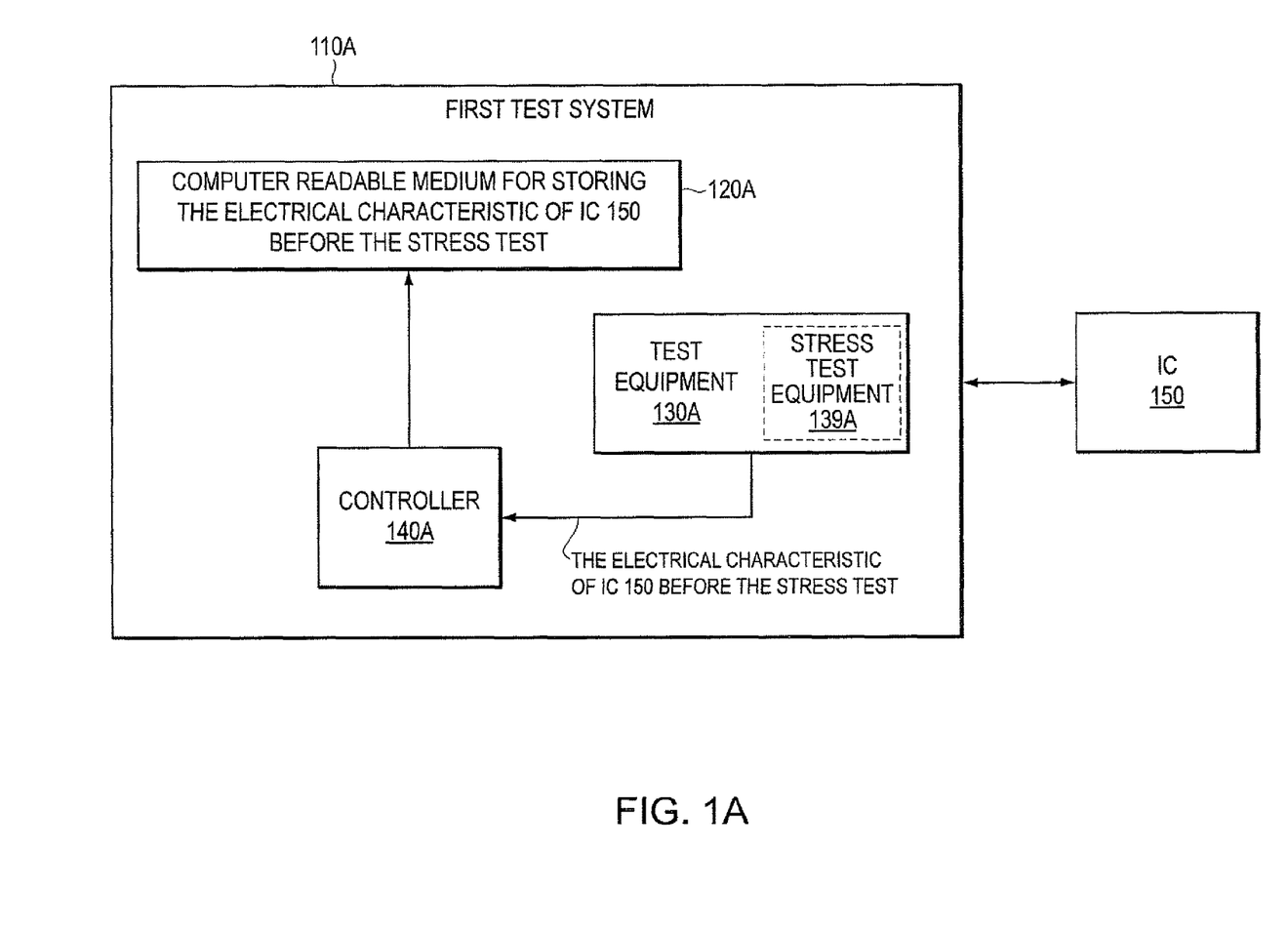
FIGS. 1A and 1B show block diagrams of a first test system 110A and a second test system 110B that test an integrated circuit (IC) 150 according to an embodiment of the disclosure.
Figure 1B:
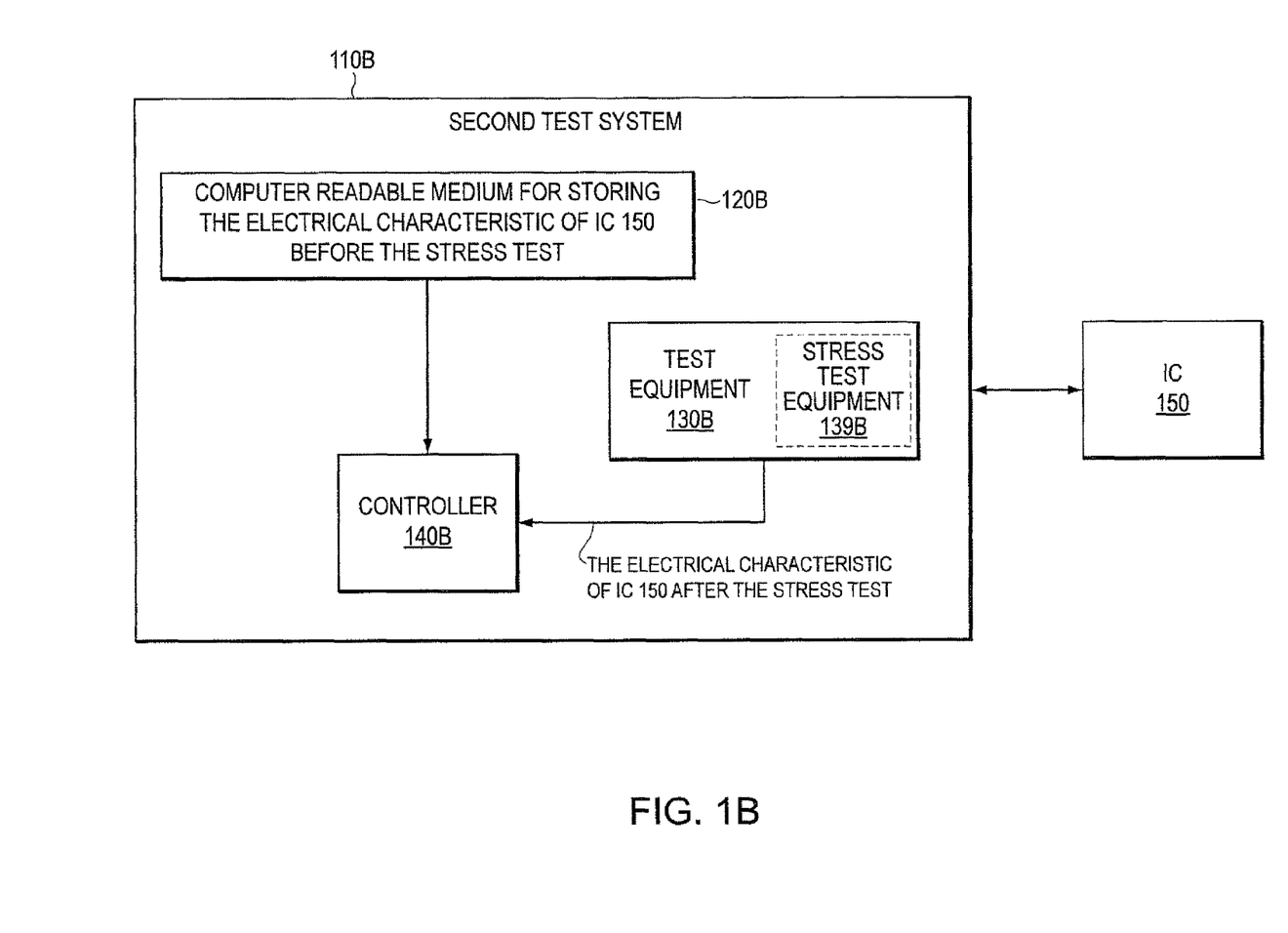

FIG. 1A and FIG. 1B show block diagrams of a first test system 110A and a second test system 110B that test an integrated circuits (IC) 150 according to an embodiment of the disclosure. The first test system 110A performs a first characterization of an electrical characteristic of the IC 150 before subjecting the IC 150 to a stress test. The second test system 110B performs a second characterization of the electrical characteristic of the IC 150 after subjecting the IC 150 to a stress test. The quality of the IC 150 is determined at least partially based on the first characterization and the second characterization. It is noted that the first test system 110A and the second test system 110B are depicted as totally separate test systems. In embodiments of the disclosure, the respective functionalities of first test system 110A and the second test system 110B are incorporate in separate devices as seen or are incorporated, wholly or partially, in the same device.

In FIG. 1A, the first test system 110A includes test equipment 130A, a computer readable medium 120A, and a controller 140A. The test equipment 130A is coupled to the IC 150 to perform the first characterization of the electrical characteristic of the IC 150 before subjecting the IC 150 to the stress test. The controller 140A stores the first characterization to the computer readable medium 120A to make the first characterization available for comparison with further characterization of the electrical characteristic of the IC 150 after subjecting the IC 150 to the stress test to determine the quality of the IC 150.

In an embodiment, the first test system 110A is an integrated test system that is suitably configured to perform various suitable tests on the IC 150. In another embodiment, the first test system 110A is a distributed test system. In an example, the readable memory medium 120A, the test equipment 130A, and the controller 140A are distributed at different locations, and are suitably coupled, such as via wired or wireless links, to communicate with each other. For example, the computer readable medium 120A is a hard disk within a database server, the test equipment 130A is a tester, and the controller 140A is configured as a processor in a desktop computer that executes software instructions for controlling the test equipment 130A to test the IC 150. During operation, the test equipment 130A performs the first characterization of the electrical characteristic of the IC 150. The controller 140A receives the first characterization, and stores the first characterization in the computer readable medium 120A within the database server to make the first characterization available for comparison with further characterization of the electrical characteristic of the IC 150 after subjecting the IC 150 to the stress test.

It is noted that, in an example, further processing is performed on the IC 150 after the first characterization and before the further characterization. Such processing includes stress test (also known as burn-in), shipping, handling, packaging, installation, and the like. For example, a stress test is performed on the IC 150 after the first characterization and before a second characterization. In an example, a stress test is a combination of temperature stress (e.g., with raised temperature), timing stress (e.g., with raised operation frequency), voltage stress (e.g., with raised supply voltage), dynamic stress (e.g., with electrically active inputs), and the like. In an embodiment, the test equipment 130A includes stress test equipment 139A that is configured to subject the IC 150 to the stress test after the first characterization, and before the second characterization. In another embodiment, the IC 150 is subjected to a stress test conducted by separate equipment (not shown) after the first characterization, and before the second characterization. A comparison between the first characterization and the second characterization can detect IC degradation due to the stress test. In another example, the IC 150 is suitably handled, shipped and packaged after the first characterization and before a second characterization. Then, a comparison between the first characterization and the second characterization can detect degradation due to the shipping, handling and packaging.

It is noted that the computer readable medium 120A can be any suitable medium, such as a hard drive, optical disc, a random access memory (RAM) unit, bar code, and the like. It is also noted that, in an example, the first characterization is suitably stored on the IC 150 itself, such as using one-time programmable memory, non-volatile memory, e-fuse and the like.

It is noted that the electrical characteristic can be any suitable characteristic, such as a minimum supply voltage (MIN_VDD) that enables the IC 150 to operate correctly, power consumption of the IC 150, a standby current of the IC 150, speed of the IC 150, and the like. It is also noted that the electrical characteristic can be a characteristic for a portion of the IC 150, or the whole circuits of the IC 150. In an example, the IC 150 includes a memory. The test equipment 130A uses memory test to perform the first characterization on the memory. In another example, the IC 150 includes scan test enabled logic circuits. The test equipment 130A uses scan test to perform the first characterization on the logic circuits. In another example, the IC 150 is configured in a normal operation mode. The test equipment 130A uses functional test to perform the first characterization on the entire IC 150.

In FIG. 1B, the second test system 110B includes test equipment 130B, a computer readable medium 120B, and a controller 140B. The computer readable medium 120B stores the first characterization of the electrical characteristic of the IC 150. The test equipment 130B is coupled to the IC 150 to perform a second characterization of the electrical characteristic of the IC 150 after subjecting the IC 150 to a stress test. In an embodiment, the test equipment 130B includes stress test equipment 139B that is configured to perform a stress test on the IC 150 before the second characterization. In another embodiment, the IC 150 is subjected to a stress test conducted by separate equipment (not shown) before the second characterization. The test equipment 130B provides the second characterization to the controller 140B. The controller 140B determines the quality of the IC 150 based on the first characterization and the second characterization of the electrical characteristic of the IC 150.

It is noted that the second test system 110B can be an integrated test system or a distributed test system. In an example, the readable memory medium 120B, the test equipment 130B, and the controller 140B are distributed at different locations, and are suitably coupled, such as via wired or wireless links, to communicate with each other. For example, the computer readable medium 120B is a hard disk within a database server, the test equipment 130B is a tester, and the controller 140B is configured as a processor in a desktop computer that executes software instructions for controlling the test equipment 130B to test the IC 150.

In an embodiment, the second test system 110B is the same integrated test system as the first test system 110A. In an example, the test system 110(A, B) performs a first characterization and stores the first characterization in the computer readable medium 120(A, B), such as a hard disk, an optical disc, a random access memory (RAM) unit, and the like. Then, the test system 110(A, B) performs a second characterization on the IC 150. Further, the test system 110 (A, B) determines the quality of the IC 150 based on a change between the first characterization and the second characterization.

It is noted that, in an example, the test system 110 (A, B) is configured to perform other test on the IC 150. For example, the test system 110 (A, B) performs stress test on the IC 150 between the first characterization and the second characterization. Then, the test system 110 (A, B) determines whether the electrical characteristic degrades due to the stress test.

In another embodiment, the second test system 110B is a different system from the first test system 110A. In an example, the first test system 110A is at a first facility, and the second test system 110B is at a second facility. The test equipment 130A performs the first characterization of the electrical characteristic of the IC 150 before subjecting the IC 150 to a stress test. The first characterization is stored on the computer readable medium 120A to be available for comparison with further characterization. For example, the first characterization is suitably transmitted and stored in the computer readable medium 120B of the second test system 110B. Also, the IC 150 is subjected to the stress test either at the first facility or the second facility. Then, the test equipment 130B performs the second characterization of the electrical characteristic on the IC 150 after subjecting the IC 150 to the stress test. The controller 140B receives the first characterization from the computer readable medium 120B, and receives the second characterization from the test equipment 130B. The controller 140B determines the quality of the IC 150 at least partially based on the first characterization and the second characterization.

It is noted that the controller 140B can determine the quality of the IC 150 online or offline with the second characterization performed by the test equipment 130B. In an offline example, the second characterization is also stored in the computer readable medium 120B. At a later time, the controller 140 receives the first characterization and the second characterization from the computer readable medium 120B and determines the quality of the IC 150.

It is noted that, in an example, the first characterization is suitably stored on the IC 150 itself, such as using one-time programmable memory, non-volatile memory, and the like. The test equipment 130B performs the second characterization on the IC 150, and also reads the first characterization from the IC 150. Then, the controller 140B determines the quality of the IC 150 at least partially based on the first characterization and the second characterization. It is noted that the controller 140B can determine the quality of the IC 150 based on a combination of other tests and the first and second characterizations.

In an embodiment, the controller 140B calculates a delta value between the first characterization and the second characterization, compares the delta value to a delta value threshold, and determines the quality of the IC 150 based on the comparison. In an example, a stress test is conducted between the first characterization and the second characterization of the electrical characteristic. The first characterization characterizes the pre-stress electrical characteristic, and the second characterization characterizes the post-stress electrical characteristic. When a change between the pre-stress electrical characteristic and the post-stress electrical characteristic is relatively small, such as smaller than a threshold, the IC 150 is considered to be a good IC. However, when the change between the pre-stress electrical characteristic and the post-stress electrical characteristic is relatively large, such as larger than a threshold, the IC 150 is considered to be a defective IC.

According to another aspect of the disclosure, the second test system 110B uses an adaptive filter, such as an adaptive Kalman filter, and the like, instead of the delta value threshold to determine the quality of IC chips. In an example, the second test system 110B is used to test multiple chips, and the IC 150 is the m-th (m is a positive integer number) chip. The second test system 110B characterizes various electrical characteristics of the IC 150, such as delta MIN_VDD, standby current, and the like. Based on the electrical characteristics, the second test system 110B uses matrix calculation to form a vector that represents the characteristics of the IC 150. The second test system 110B compares the vector to a vector limit that is determined based on testing of previous chips, such as the first chip to the (m−1)-th chip, to determine the quality of the IC 150. When the IC 150 passes the test, the limit is updated based on the vector of the IC 150; otherwise, the limit keeps the same. Then, the limit is used to determine the quality of the (m+1)-th chip.

According to an aspect of the disclosure, the first and second test systems 110A and 110B can be used in IC production test to reduce test time, and improve detectability for, e.g. early failure. For example, stress test is used in IC production test to detect early failure, and is generally time consuming. In a comparison test system example, the first characterization and the second characterization are compared to a deterministic threshold to determine the quality of an IC. For example, the comparison test system performs the first characterization on an IC, and compares the first characterization with the deterministic threshold. When the first characterization is smaller than the deterministic threshold, for example, the IC is considered to be a potentially good IC; otherwise, the IC is a defective IC. Then, the comparison test system applies stress test on the potentially good IC. After the stress test, the comparison test system performs the second characterization on the potentially good IC, and compares the second characterization with the deterministic threshold. When the second characterization is smaller than the deterministic threshold, the IC is considered as a good IC; otherwise, the IC is a defective IC.

For the comparison test system, it may take long time to degrade the electrical characteristic of a defective IC to be above the deterministic threshold. Thus, in order to detect the defective IC, a relatively long stress time is needed. When the stress time is not enough, the defective IC is not detectable.

The test systems 110A and 110B compare the pre-stress electrical characteristic with the post-stress electrical characteristic. In an example, when a delta value threshold is suitably chosen, defective ICs are detected with reduced stress time, and the stress test has relatively high detectability for early failure.

According to another aspect of the disclosure, the test systems 110A and 110B can be configured to detect unhealthy process. In an example, an electrical characteristic, such as MIN_VDD, is process-dependent and product-independent. Generally, products using the same library, generally, have substantially same MIN_VDD when the process is healthy. When the first test system 110A is configured to store the characterizations of MIN_VDD, statistic study on the characterizations can be used to detect abnormality of the process.

Figure 2:
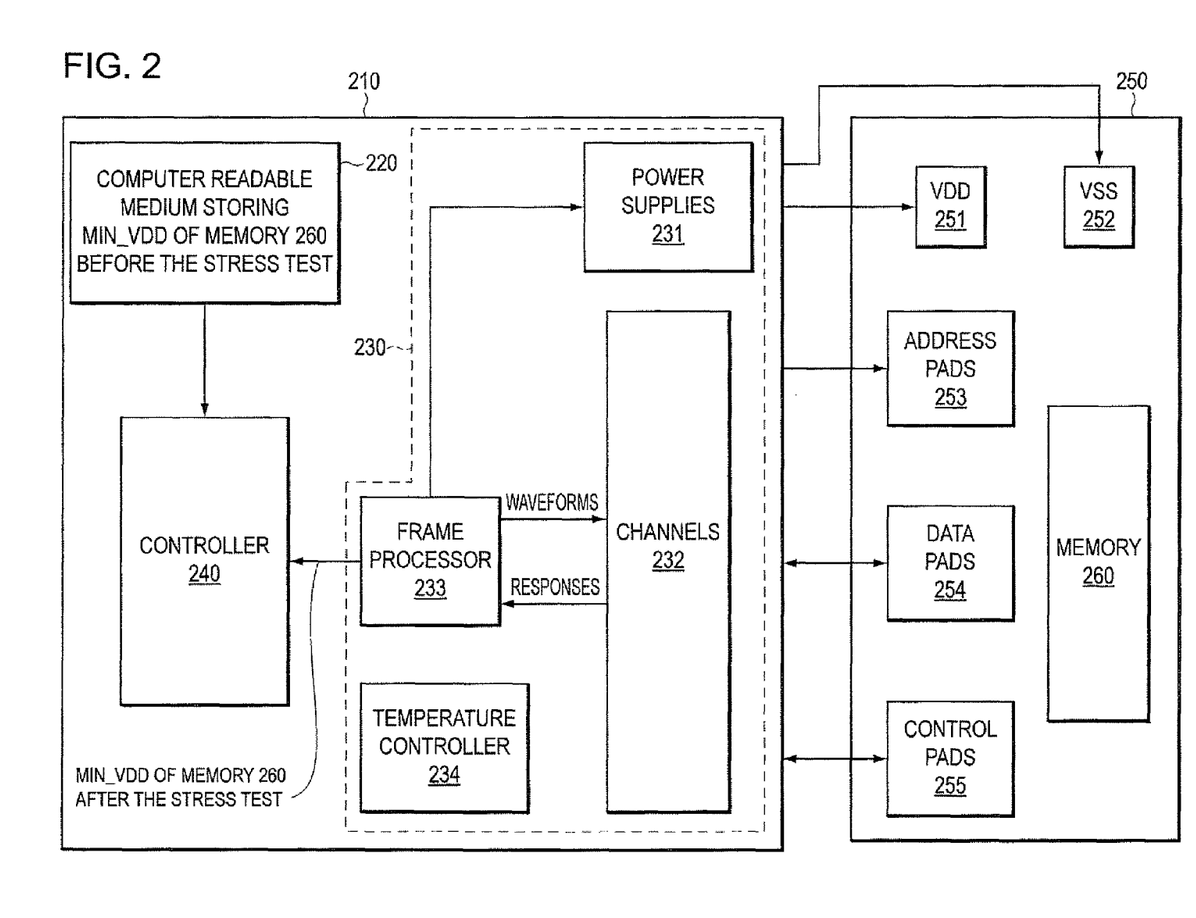
FIG. 2 shows a block diagram of a test system 210 that tests an integrated circuit (IC) 250 according to an embodiment of the disclosure.

FIG. 2 shows a block diagram of a test system 210 that tests an integrated circuit (IC) 250 according to an embodiment of the disclosure. The IC 250 includes functional circuits, such as a memory 260, logic circuits (not shown). The test system 210 determines the quality of the IC 250 at least partially according to MIN_VDD that allows the memory 260 to operate correctly. The test system 210 includes a computer readable medium 220, test equipment 230 and a controller 240. In an embodiment, the test equipment 230 performs a first characterization of the MIN_VDD for the memory 260 before subjecting the IC 250 to a stress test. The computer readable medium 220 stores the first characterization. Then, the test equipment 230 performs a second characterization of the MIN_VDD on the memory 260 after subjecting the IC 250 to the stress test. The controller 240 determines the quality of the IC 250 at least partially based on a delta value between the first characterization and the second characterization of the MIN_VDD.

In an embodiment, the IC 250 uses pads or pins to interface the memory 260 with the test equipment 230. In an example, the IC 250 is on a wafer, the IC 250 includes various pads, such as power pads VDD 251 and VSS 252, address pads 253, data pads 254, and control pads 255. The test equipment 230 includes a wafer prober that uses needles to make electrical contacts to the pads. In another example, the IC 250 is assembled in an IC package. The IC package includes pins that are electrically connected with the various pads. The test equipment 230 includes a package handler having a testing socket. When the IC package is put in the testing socket, the pins are electrically connected with the test equipment 230.

The test equipment 230 includes power supplies 231, channels 232, and a frame processor 233. The power supplies 231 are coupled to the power pads VDD 251 and VSS 252 to provide power to the IC 250. The power supplies 231 can be suitably controlled, for example, by the frame processor 233, to adjust the power provided to the IC 250. In an example, a supply voltage provided by the power supplies 231 is adjustable. In addition, in an example, the power supplies 231 are used to determine power provided to the IC 250. In an example, the power supplies 231 are configured to measure a current flowing to the IC 250. Based on the current flowing to the IC 250 and the supply voltage, power consumption of the IC 250 can be determined.

The channels 232 include suitable components for testing purpose. In an example, a channel includes driving circuits that can be configured to drive a specific voltage or current. In addition, the channel includes sensing circuits that can be configured to sense electrical responses, such as voltage, current, and the like.

The frame processor 233 controls the power supplies 231 and the channels 232 and analyzes the sensed responses from the power supplies 231 and the channels 232. In an example, the frame processor 233 controls the power supplies 232 to provide a supply voltage to the IC 250. Further, the frame processor 233 controls the power supplies 232 to measure a current flowing through the IC 250. Then, the frame processor 233 determines the power consumption of the IC 250. In another example, the frame processor 233 stores test patterns, generates electrical waveforms based on the test patterns, and provides the electrical waveforms to the channels 232. The channels 232 drive the electrical waveforms to the IC 250 and sense responses from the IC 250. Then, the channels 232 provide the sensed responses to the frame processor 233. The frame processor 233 analyzes the responses, and determines the electrical characteristic of the IC 250 based on the analysis.

In an embodiment, the test equipment 230 includes a temperature controller 234 that is configured to adjust a chip temperature of the IC 250. Further, in an embodiment, the test equipment 230 is configured to provide operation clocks (not shown) to the IC 250. The test equipment 230 can suitably adjust the clock frequency.

In an embodiment, the test equipment 230 is configured to perform MIN_VDD characterization for the memory 260. Specifically, the frame processor 233 executes instructions corresponding to a search algorithm to search for MIN_VDD that enables the memory 260 to operate correctly. In an example, the frame processor 233 controls the power supplies 231 to provide a specific supply voltage to the IC 250. Then, the frame processor 233 instructs the channels 232 to drive electrical waveforms to test the memory 260. The channels 232 also receive responses from the memory 260. The frame processor 233 analyzes the responses to determine whether the memory 260 operates correctly under the specific supply voltage. In an embodiment, the frame processor 233 starts from a relatively large supply voltage, and then reduces the supply voltage until the memory 260 fails the test. In another example, the frame processor 233 specifies the supply voltage according to a binary search algorithm.

According to an aspect of the disclosure, the frame processor 233 uses any suitable memory functional test or memory test algorithm, such as March-LR, GALPAT, MATS++, March C+, Retention test, and the like, for searching the MIN_VDD. Such tests are disclosed in "An Open Notation for Memory Tests" by Aad Offerman et al., and "Testing of Modern Semiconductor Memory Structure" by Georgi Nedeltchev Gaydadjiev, which are incorporated herein by reference in their entirety. In an example, destructive read test is sensitive to supply voltage. Then, the frame processor 233 generates the electrical waveforms corresponding to the destructive read test.

The computer readable medium 220 stores the first characterization of the MIN_VDD for the memory 260. In an embodiment, the test equipment 230 performs the first characterization of the MIN_VDD for the memory 260. The first characterization is then stored in the computer readable medium 220. In another embodiment, another test equipment (not shown) performs the first characterization of the MIN_VDD. The first characterization is suitably transmitted and stored in the computer readable medium 220.

In an embodiment, the test equipment 230 performs the stress test before the second characterization of the MIN_VDD. In an example, the power supplies 231 provide a supply voltage that is raised above normal supply voltage, such as 1.5 times of the normal supply voltage, to the IC 250. The temperature controller 234 heats up the IC 250 to raise chip temperature, such as to about 140° C. The test equipment 230 also raises the clock frequency for clocks provided to the IC 250. Further, the frame processor 233 instructs the channels 232 to drive electrical waveforms to the memory 260. In an example, the electrical waveforms are generated according to any suitably memory functional test. For example, the electrical waveforms can be the same as the electrical waveforms generated for characterizing the MIN_VDD.

It is noted that, in an embodiment, separate equipment is used to conduct the stress test on a plurality of ICs at the same time.

After the stress test, the test equipment 230 is configured to perform a second characterization of the MIN_VDD for the memory 260.

The controller 240 determines the quality of the IC 250 at least partially based on the first characterization of the MIN_VDD read from the computer readable medium 220, and the second characterization of the MIN_VDD performed by the test equipment 230. In an embodiment, the controller 240 calculates a delta value of the MIN_VDD between the first characterization and the second characterization, and determines the quality of the IC 250 at least partially based on the delta value. In an example, stress test is performed on the memory 260, for example, by the test equipment 230, after the first characterization and before the second characterization. Thus, the first characterization corresponds to a pre-stress MIN_VDD, and the second characterization corresponds a post-stress MIN_VDD. The controller 240 calculates a delta MIN_VDD between the pre-stress MIN_VDD and the post-stress MIN_VDD, and determines the quality of the IC 250 at least partially based on the delta MIN_VDD. For example, when the delta MIN_VDD is larger than a threshold, the controller 240 determines that the memory 260 degrades significantly due to the stress test, and thus the IC 250 is determined to be a defective IC. Otherwise, the controller 240 determines that the IC 250 is a good IC.

It is noted that the stress test can be any suitable stress test. In an example, the stress test repetitively reads and/or writes the cells in the memory 260. In another example, the stress test is a combination of temperature stress (e.g., raised temperature), timing stress (e.g., raised operation frequency), voltage stress (e.g., raised supply voltage), dynamic stress (e.g., electrically active inputs), and the like.

Figure 3:
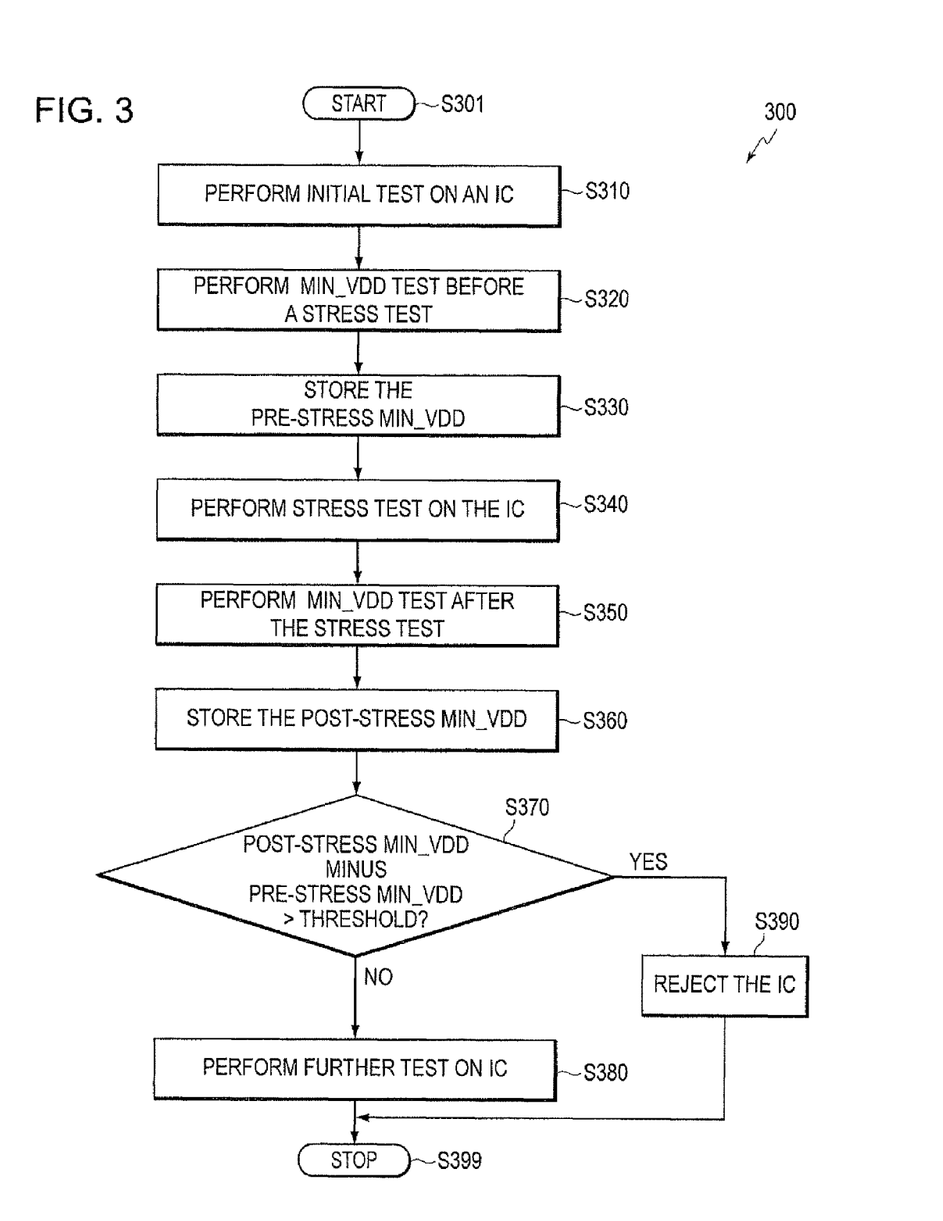
FIG. 3 shows a flowchart outlining a process example 300 for testing an IC according to an embodiment of the disclosure.

FIG. 3 shows a flowchart outlining a process example 300 for the test system 210 to test the IC 250 according to an embodiment of the disclosure. The process 300 starts from S301 and proceeds to S310.

At S310, the test system 210 performs initial test on the IC 250. The initial test includes any suitable test that may be performed before the MIN_VDD test, such as contact test, functional test, parametric test, and the like.

At S320, the test system 210 performs a first characterization of the MIN_VDD of the memory 260 on the IC 250. In an embodiment, the test system 210 searches in a supply voltage range for the MIN_VDD that the memory 260 passes a destructive read test. It is noted that, in an example, the destructive read test writes "1" or "0" to the memory 260, reads multiple times after the writing, and determines whether the read back values match the written value. It is also noted that the test system 210 can use any suitable search algorithm, such as binary search, and the like, to search for the MIN_VDD. It is also noted that the test system 210 can use any suitable functional tests besides the destructive read test.

At S330, the test system 210 stores the first characterization as pre-stress MIN_VDD in the computer readable medium 220.

At S340, the test system 210 performs stress test on the IC 250. In an embodiment, the test system 210 repetitively writes to the memory 260 and reads from the memory 260. In another embodiment, the power supplies 231 provide raised supply voltage to the IC 250. The temperature controller 234 heats up the IC 250 to raise chip temperature. The test equipment 230 also raises the clock frequency for clocks provided to the IC 250. Further, the frame processor 233 instructs the channels 232 to drive electrical waveforms to the memory 260. In an example, the electrical waveforms are generated according to any suitably memory functional test. For example, the electrical waveforms can be the same as the electrical waveforms generated for characterizing the MIN_VDD. It is noted that the test system 210 can perform other suitable test, such as functional test, scan test, other parametric test, and the like on the IC 250.

At S350, the test system 210 performs a second characterization of the MIN_VDD of the memory 260 on the IC 250. In an embodiment, the test system 210 searches in a supply voltage range for the MIN_VDD that the memory 260 passes a destructive read test. It is noted that the supply voltage range can be the same as the first characterization or can be different from the first characterization. It is noted that, in an example, the destructive read test writes "1" or "0" to the memory 260, reads multiple times after the writing, and determines whether the read back values match the written value. It is also noted that the test system 210 can use any suitable search algorithm, such as binary search, and the like, to search for the MIN_VDD. It is also noted that the test system 210 can use any suitable functional tests besides the destructive read test.

At S360, the test system 210 stores the second characterization as post-stress MIN_VDD in the computer readable medium 220.

At S370, the test system 210 determines whether a delta value between the post-stress MIN_VDD and the pre-stress MIN_VDD is larger than a threshold. When the delta value is larger than the threshold, the process proceeds to S390; otherwise, the process proceeds to S380.

At S380, the test system 210 performs further test, such as further functional test, parametric test, and the like on the IC 250. Based on the further test result, the test system 210 determines the quality of the IC 250. Then, the process proceeds to S399 and terminates.

At S390, the test system 210 determines that the IC 250 is defective, and rejects the IC 250. Then, the process proceeds to S399 and terminates.

It is noted that the process 300 can be suitably modified. In an example, the threshold is a deterministic threshold. The test system 210 skips S350-S370, and tests whether the memory 260 passes destructive test under a supply voltage that is a sum of the pre-stress MIN_VDD and the threshold. In another example, the threshold is an adaptive threshold. The test system 210 updates the adaptive threshold in S380.

Figure 4:
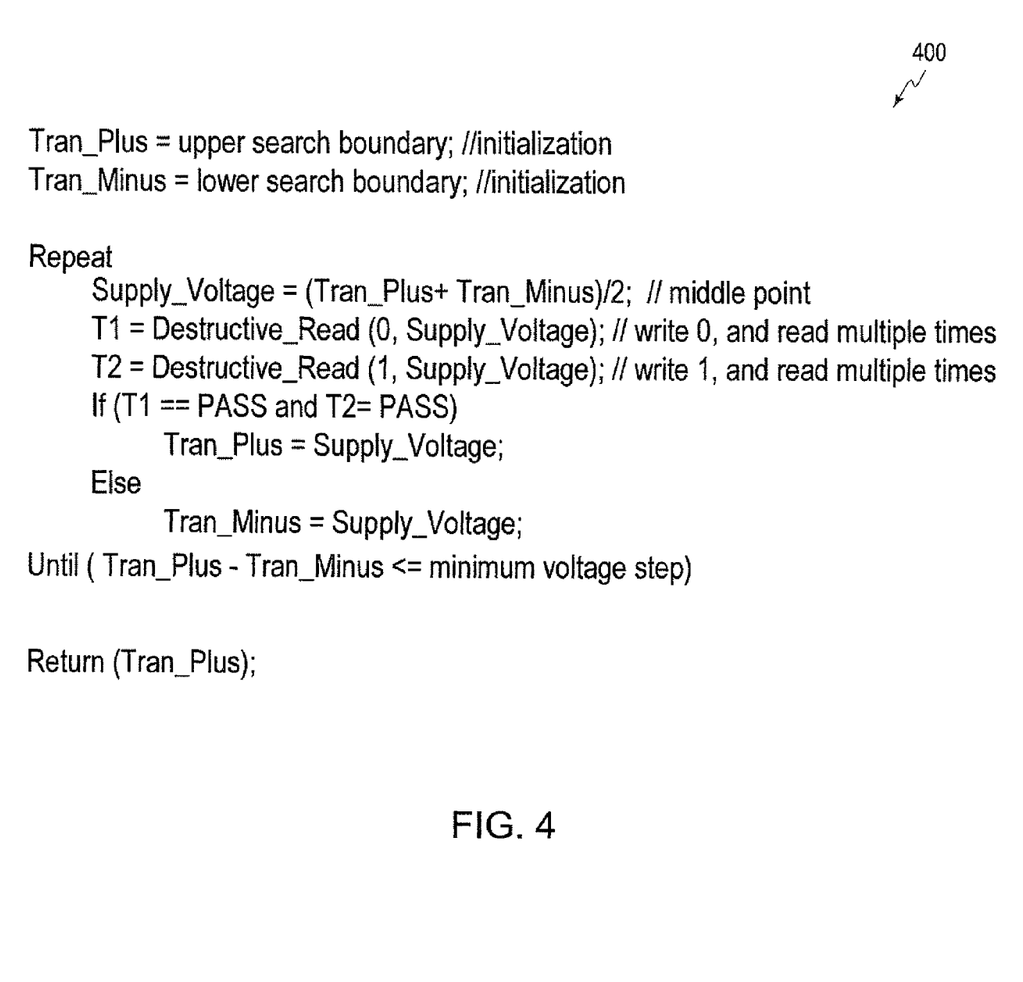
FIG. 4 shows an algorithm example 400 according to an embodiment of the disclosure.

FIG. 4 shows an algorithm example 400 according to an embodiment of the disclosure. The algorithm 400 uses a binary search to search a minimum supply voltage in a voltage range under which a memory passes destructive read test.

Figure 5:
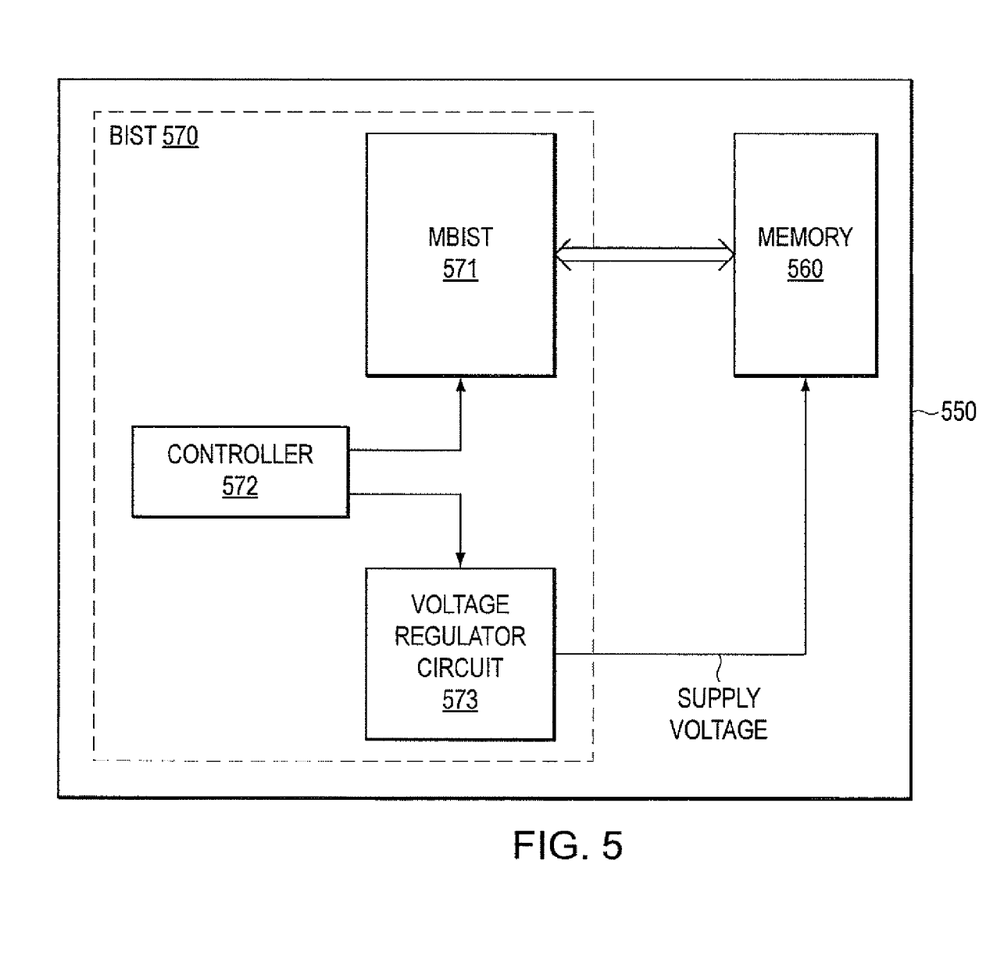
FIG. 5 shows a block diagram of an IC example 550 according to an embodiment of the disclosure.

FIG. 5 shows a block diagram of an IC example 550 according to an embodiment of the disclosure. The IC 550 includes functional circuits, such as memory 560, and the like. Further, the IC 550 includes built-in self test (BIST) 570 configured to perform, in a test mode, built-in self test on the functional circuits. According to an embodiment of the disclosure, the BIST 570 is configured to perform a first characterization of the functional circuits before subjecting the functional circuits to a stress test, and perform a second characterization of the functional circuits after subjecting the functional circuits to the stress test.

In an example, the BIST 570 includes a memory BIST (MBIST) 571 configured to perform memory built-in self test on the memory 560, a voltage regulator circuit 573 configured to regulates a supply voltage to the memory 560, and a controller 572. In an embodiment, the controller 572 controls the voltage regulator circuit 573 and the MBIST 571 to test the memory 560 to determine a minimum supply voltage (MIN_VDD) under which the memory 560 passes built-in self test.

For example, the controller 572 controls the voltage regulator circuit 573 to provide supply voltage starting from a relatively high value, and reduce the supply voltage step by step. At each step, the controller 572 controls the MBIST 571 to perform the memory built-in self test, and determines whether the memory 560 passes or fails the test. When the memory 560 passes the test, the controller 572 controls the voltage regulator circuit 573 to further reduce the supply voltage. When the memory 560 fails the test, the controller 572 determines that the supply voltage in the previous step is the MIN_VDD. The MIN_VDD can be stored on the IC 550 or exported to an external storage device.

It is noted that in an embodiment, the BIST 570 is configured to perform a stress test (e.g., with voltage stress and dynamic stress) on the memory 560 between the first and the second characterizations. In another embodiment, the IC 550 is subjected to stress test between the first and the second characterizations by stress-test equipment. After the second characterization, the pre-stress MIN_VDD and the post-stress MIN_VDD are compared to determine a quality attribute of the IC 550.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A method for testing, comprising:
repeatedly calculating an average value of an upper limit and a lower limit of a range of an electrical characteristic of an integrated circuit (IC), performing a pair of different tests on the IC at the calculated average value, updating one of the upper limit and the lower limit based on results of the tests, until a difference between the upper limit and the lower limit becomes less than a threshold value;
subjecting the IC to a stress test;
characterizing the electrical characteristic of the IC subsequently to subjecting the IC to the stress test; and
determining a quality attribute of the IC based on a comparison of the respective electrical characteristics of the IC before and after subjecting the IC to the stress test.

2. The method of claim 1, wherein repeatedly calculating the average value further comprises:
characterizing the electrical characteristic of the IC before subjecting the IC to the stress test.

3. The method of claim 1, wherein repeatedly calculating the average value further comprises at least one of:
determining a minimum supply voltage required to enable the IC to successfully pass a functional test;
determining a standby current of the IC; and
determining a power consumption of the IC.

4. The method of claim 1, wherein repeatedly calculating the average value further comprises:
determining the electrical characteristic of the IC based on stored data of a previous characterization for the IC.

5. The method of claim 1, wherein determining the quality attribute of the IC based on a comparison of the respective electrical characteristics of the IC before and after subjecting the IC to the stress test further comprises:
calculating a delta value between the electrical characteristics of the IC before and after subjecting the IC to the stress test;
comparing the delta value to a delta value threshold; and
determining the quality attribute of the IC based on the comparison.

6. An IC that is tested using the method of claim 1.

7. The method of claim 1, wherein characterizing the electrical characteristic of the IC subsequently to subjecting the IC to the stress test further comprises:
characterizing a minimum supply voltage required to enable the IC to successfully pass a functional test.

8. The method of claim 7, wherein characterizing the minimum supply voltage required to enable the IC to successfully pass the functional test further comprises:
characterizing a minimum supply voltage required to enable a memory on the IC to successfully pass a destruction-read test.

9. The method of claim 7, wherein characterizing the minimum supply voltage required to enable the IC to successfully pass the functional test further comprises:
searching in a supply voltage range a transition supply voltage above which the IC passes the functional test, and below which the IC fails the functional test.

10. A test system, comprising:
stress equipment configured to subject an integrated circuit (IC) to a stress test;
test equipment configured to perform test to characterize an electrical characteristic of the IC; and
a controller configured to determine the electrical characteristic of the IC before the stress test by repeatedly calculating an average value of an upper limit and a lower limit of a range of the electrical characteristic of the IC, performing a pair of different tests on the IC at the calculated average value, updating one of the upper limit and the lower limit based on results of the tests, until a difference between the upper limit and the lower limit becomes less than a threshold value, control the test equipment to characterize the electrical characteristic of the IC subsequently to subjecting the IC to the stress test, and determine a quality attribute of the IC based on a comparison of the respective electrical characteristics of the IC before and after subjecting the IC to the stress test.

11. The test system of claim 10, wherein the controller is configured to control the test equipment to characterize the electrical characteristic of the IC before subjecting the IC to the stress test.

12. The test system of claim 10, wherein
the test equipment is configured to perform test to characterize at least one of a standby current of the IC, and a power consumption of the IC.

13. The test system of claim 10, wherein the controller is configured to determine the electrical characteristic of the IC before the stress test based on stored data of a previous characterization of the IC.

14. The test system of claim 10, wherein the controller is configured to calculate a delta value between the electrical characteristics of the IC before and after subjecting the IC to the stress test, compare the delta value to a delta value threshold, and determine the quality attribute of the IC based on the comparison.

15. An IC that is tested by the test system of claim 10.

16. The test system of claim 10, wherein
the test equipment includes a power supply configured to provide supply voltage to the IC; and
the controller is configured to control the power supply to adjust the supply voltage to the IC in a supply voltage range, and control the test equipment to characterize a minimum supply voltage required to enable the IC to successfully pass a functional test.

17. The test system of claim 16, wherein
the test equipment is configured to perform a destruction-read test on a memory of the IC; and
the controller is configured to control the power supply to adjust the supply voltage to the IC, and control the test equipment to characterize a minimum supply voltage required to enable the memory to successfully pass the destruction-read test.

18. An integrated circuit (IC), comprising:
a functional circuit; and
a built-in-self-test (BIST) module configured to repeatedly calculate an average value of an upper limit and a lower limit of a range of an electrical characteristic of the functional circuit, perform a pair of different built-in self tests on the functional circuit at the calculated average value, update one of the upper limit and the lower limit based on results of the tests, until a difference between the upper limit and the lower limit becomes less than a threshold value to determine the electrical characteristic of the functional circuit before subjecting the functional circuit to a stress test, perform another built-in self test to determine the electrical characteristic of the functional circuit after subjecting the functional circuit to the stress test, and determine a quality attribute of the functional circuit based on a comparison of the respective electrical characteristics of the functional circuit before and after the stress test.

19. The IC of claim 18, wherein
the functional circuit includes a memory; and
the BIST module includes a memory BIST (MBIST) configured to perform, before subjecting the memory to a stress test, a destruction-read test on the memory under different supply voltages to determine a first minimum supply voltage to enable the memory to successfully pass the destruction-read test, perform, after subjecting the memory to the stress test, the destruction-read test on the memory under different supply voltages to determine a second minimum supply voltage to enable the memory to successfully pass the destruction-read test, and determine a quality attribute of the functional circuit based on a comparison of the first minimum supply voltage and the second minimum supply voltage.

20. The IC of claim 19, further comprising:
a voltage regulator circuit configured to adjust the supply voltage provided to the memory.

* * * * *